(12) United States Patent
Lürkens

(10) Patent No.: US 7,408,356 B2
(45) Date of Patent: Aug. 5, 2008

(54) METHOD OF DETERMINING A ZERO POINT OF A CURRENT SENSOR

(75) Inventor: Peter Lürkens, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/572,835

(22) PCT Filed: Sep. 9, 2004

(86) PCT No.: PCT/IB2004/051718

§ 371 (c)(1),
(2), (4) Date: Apr. 17, 2007

(87) PCT Pub. No.: WO2005/029113

PCT Pub. Date: Mar. 31, 2005

(65) Prior Publication Data

US 2007/0188105 A1    Aug. 16, 2007

(30) Foreign Application Priority Data

Sep. 22, 2003 (EP) .................................. 03103502

(51) Int. Cl.
*G08B 1/00* (2006.01)
(52) U.S. Cl. .................... 324/414; 315/200 R; 315/219
(58) Field of Classification Search ................. 324/414; 315/200 R, 219
See application file for complete search history.

(56) References Cited

U.S. PATENT DOCUMENTS

| 4,507,569 A | * | 3/1985 | Hess, II ....................... 307/130 |
| 4,734,624 A | | 3/1988 | Nagase et al. |
| 5,422,546 A | * | 6/1995 | Nilssen ....................... 315/219 |
| 2002/0014856 A1 | | 2/2002 | Buij et al. |

FOREIGN PATENT DOCUMENTS

| EP | 0583841 A2 | 2/1994 |
| EP | 0877232 A2 | 11/1998 |
| JP | 02141673 A | 5/1990 |
| JP | 04134270 A | 5/1992 |
| JP | 04184267 A | 7/1992 |
| WO | 9908373 A2 | 2/1999 |

* cited by examiner

Primary Examiner—Vincent Q Nguyen

(57) ABSTRACT

A method of determining a zero point of a current sensor in a circuit arrangement for operating a gas discharge lamp includes switching off the current through the sensor for a short period during a first half wave and determining a first test value. Then the current through the sensor is switched off for a short period during a second half wave having a different polarity and a second test value is determined. The average value of the two test values is formed and the zero point is determined using the average value. It is prevented thereby that the zero point drifts during lamp operation, and that amplitudes of the positive and negative half waves of the lamp current are formed differently.

8 Claims, 1 Drawing Sheet

METHOD OF DETERMINING A ZERO POINT OF A CURRENT SENSOR

The invention relates to a method of determining a zero point of a current sensor in a circuit arrangement for operating a gas discharge lamp.

U.S. Pat. No. 4,734,624 discloses such an electronic circuit arrangement with a DC-AC converter. The DC-AC converter comprises four transistors connected two-by-two in series so as to form two half bridges. The two half bridges are connected in parallel between an operating potential and a reference potential. A freewheel diode is connected in parallel to each of the individual transistors. The half bridges act as DC-AC converters and provide a square-wave alternating current for operating the gas discharge lamp. The gas discharge lamp itself forms part of a series circuit which comprises a first coil, followed by the gas discharge lamp, and then a second coil downstream thereof. This series circuit is connected between the outputs of the two half bridges. The series circuit is completed by a capacitor which is connected in parallel to the gas discharge lamp and the second coil. The gas discharge lamp is a UHP or HID lamp. UHP is short for Ultra High Pressure or Ultra High Performance, and HID is short for High Intensity Discharge. The circuits are essentially used for data and video projectors. Bipolar current sensors are used in the circuits for measuring and controlling the lamp current. The bipolar current sensor is arranged in the series circuit between one of the coils and the gas discharge lamp. The signal of the sensor is measured before starting of the lamp, so as to lay down the zero point. If this zero point shifts during lamp operation, for example owing to heating, amplitudes of the positive and negative half-waves of the lamp current will appear to be unequal. This leads to an impairment of lamp life and also to visible artefacts in the presented projection image.

The invention accordingly has for its object to provide a simple method and a simple circuit arrangement for zero point determination during operation.

In accordance with one embodiment, this object is achieved by the following process steps: the current through the sensor is switched off for a short period during a first half wave and a first test value is determined, then the current through the sensor is switched off for a short period during a second half wave having a different polarity and a second test value is determined, whereupon an average is formed of the two test values, and the zero point is determined by means of the average value in that a weighted sum of the average value and the value assumed up to that time for the sensor zero point (Vx) is formed. A reliable determination of the zero point, also denoted sensor zero point hereinafter, is possible when the current in the sensor itself is known by some other method. For this purpose, the current supply is switched off or interrupted by deactivation of all power transistors during operation for a short period not visible to the human eye, for example during the positive current half wave. A current scanning void is thus created. It can be achieved thereby that the current in the sensor drops to zero within a few microseconds. A suitable time period is, for example, 100 μs. This time period is sufficiently long for reliably bringing the current in the sensor to zero and in addition renders possible a substantial decay of response phenomena in the filters of the current measuring circuit. A full response, however, takes infinitely long, so that now only residual values of an earlier measurement are active. A first test value is now determined. To compensate for the effect of residual values of earlier measurements, the switch-off action is repeated for the same duration in one of the subsequent half waves having a different polarity. The residual value now has a negative sign. A second test value is thus determined. In both cases, however, the sensor zero point is present as a constant component, so that an average value of the two supplies an improved estimation for the zero point error, also denoted deviation from zero hereinafter, as a sensor offset or offset error. Once the sensor offset has been finally and correctly determined, no further corrections are provided.

To reduce the visibility of the current scanning voids, various further measures may be advantageously taken. The eye is particularly insensitive when a current scanning void, and thus a reduction in light, is compensated by a corresponding additional quantity of light within a short time distance, so that the same average light power is obtained over a period of approximately 10 ms as in the operating phases without current scanning void. Since the change of the sensor zero point normally takes place very slowly, measurements are not frequently necessary. It is accordingly sufficient to repeat the measurement at intervals of several seconds up to minutes. A distance in time may be varied so as to reduce the visibility of the current scanning voids further. This renders it impossible for a viewer to adjust himself/herself to a fixed waiting interval. A certain position in time in the lamp current is imaged in a certain location of the projection screen in the case of time-sequentially operating projection systems. It is also advisable in such systems to vary the position of the current scanning void, also denoted measuring pulse or scanning pulse hereinafter, in regard of the resulting picture screen position so as to distribute any visible effects over the entire picture screen. It is possible to operate initially with a higher measuring frequency and later with a lower measuring frequency so as to obtain a suitable zero point as quickly as possible after the start of the projector. An interval between two measuring groups, each group consisting of two measurements in half waves of different polarity in quick succession, amounts to several seconds up to minutes, i.e. the measuring interval lies between 10 seconds and 5 minutes, advantageously between 50 seconds and 2 minutes.

The invention will now be explained in more detail for better understanding with reference to an embodiment and the drawing, in which.

Figure 1:
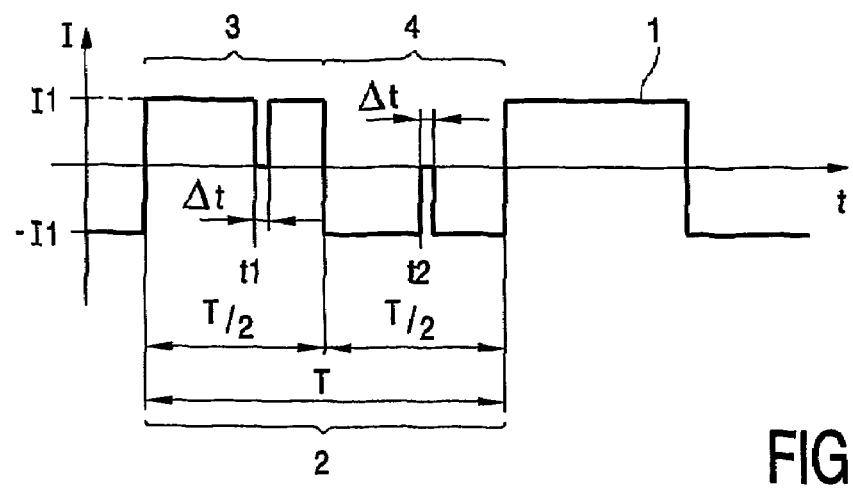
FIG. 1 is a time diagram with a square-wave lamp current.

FIG. 1 shows a square-wave current signal gradient 1 through a gas discharge lamp. Assuming the sensor to operate correctly, the absolute value I1 of the lamp current will remain the same within a period 2, only the sign changes, so that a positive and a negative current +I1 and −I1 are obtained in respective half periods 3 and 4. The period 2 covers a time span T, and the two half periods accordingly each have a duration T/2. The half period 3, 4 is also denoted half cycle or half wave for this reason. A square-wave current gradient and a circuit arrangement suitable for generating it are described in U.S. Pat. No. 4,734,624. The contents of U.S. Pat. No. 4,734,624 are to be regarded as included in the present document. The lamp current 1 is interrupted in the first half cycle 3 of positive polarity from a moment t1 onwards for a duration of Δt so that a current scanning void is created. The lamp current 1 is similarly interrupted for the same duration Δt in the second half cycle 4 of negative polarity from a moment t2 onwards.

Figure 2:
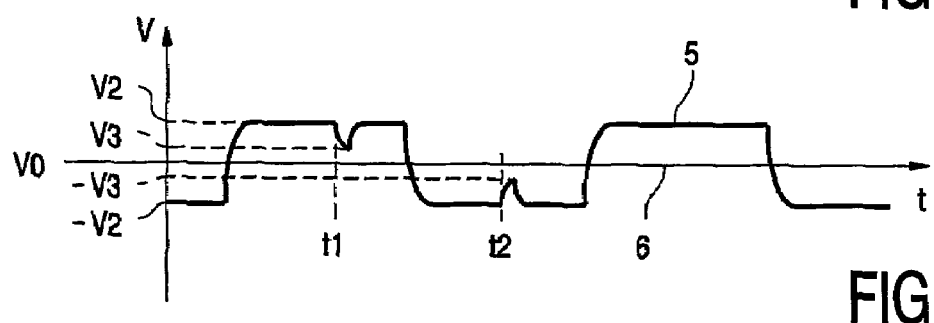
FIG. 2 is a second time diagram with a sensor signal.

FIG. 2 shows a voltage signal 5 of a sensor which is a representation of the lamp current 1 and which is symmetrical with respect to a zero line 6. The zero line 6, also denoted real zero line below, passes through the zero point V0 of the sensor, also denoted real zero point V0 of the sensor below. This means that the line through the zero point V0 represents an output signal of the sensor that is actually obtained for a zero current value. At moment t1, the voltage 5 within the sensor starts to drop exponentially from a value V2 to a value V3 owing to the influence of filters and bandwidth limiters, which value V3 is reached after a period of Δt. At moment t2, the voltage 5 within the sensor starts rising exponentially from a value −V2 to a value −V3, which value −V3 is reached after a period of Δt. The values V3 and −V3 represent residual values of former measured values. Assuming that a value already placed in a memory or stored on the basis of an earlier measurement, also denoted assumed zero point below, is identical to V0, the two values V3 and −V3 will exactly cancel each other out. A correction of the zero point is not necessary. The absolute values of the residual levels V3 and −V3 are identical for the two half cycles 3 and 4.

Figure 3:
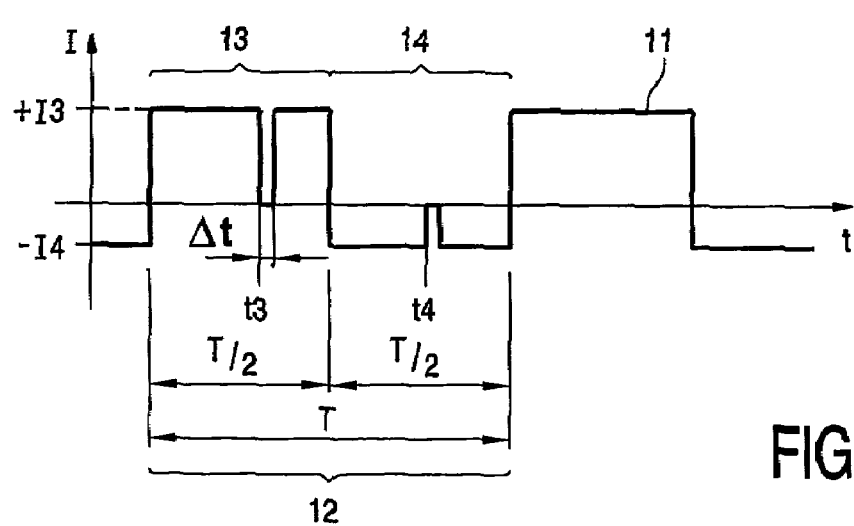
FIG. 3 is a third time diagram with a second square-wave lamp current.

FIG. 3 shows a square-wave current gradient 11 which results from a difference between the assumed zero point Vx of the sensor and the real zero point V0. A positive and a negative current +I3 and −I4 of different quantitative values arise within a period 12 for the respective half cycles 13 and 14. The period 12 has a duration T, so the half cycles 13 and 14 each have a duration T/2. The lamp current 1 is interrupted in the first half cycle 13 of positive polarity from a moment t3 onwards for a duration of Δt. The lamp current is similarly interrupted for the duration Δt in the second half cycle 14 of negative polarity from moment t4.

Figure 4:
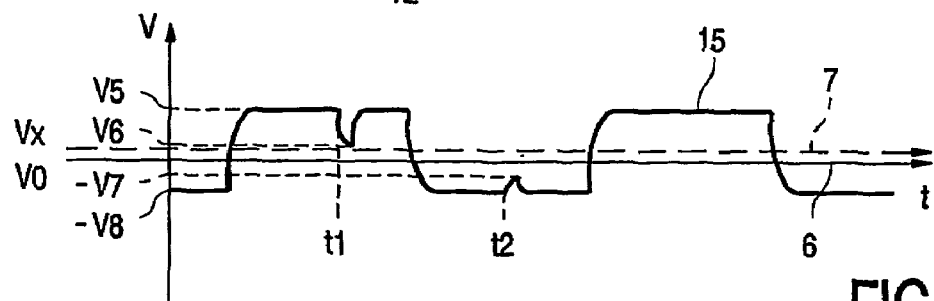
FIG. 4 is a fourth time diagram with a second sensor signal.

FIG. 4 shows the voltage signal 15 of a sensor with the real zero line 6 and the assumed zero line 7. During the first half cycle 3, the voltage 15 starts dropping exponentially from a value V5 to a value V6 at moment t1. The value V6 is reached after a time duration of Δt just before the lamp current 1 is switched on again, the distance of V6 to the assumed zero line 7 being measured and stored. In the second, negative half cycle 4, the voltage 15 starts rising exponentially from a value −V8 to a value −V7 at moment t2. This value −V7 is reached after a time duration of t just before the lamp current is switched on again, the distance of −V7 to the assumed zero line 7 also being measured and stored. The distances Vx-V5 and Vx-(−V7 are added together, divided by two, possibly weighted, and added to the value Vx. The resulting new value for Vx now lies closer to the correct value V0 than the previous value for Vx. When the procedure is repeated several times, the difference between V0 and the value of Vx becomes increasingly smaller until the correct sensor zero point has been determined. This procedure is also denoted the determination, definition, or compensation of the sensor zero value V0 or the determination of the deviation. A single measuring cycle suffices in the case in which the sensor signal has already become fully stabilized at the moment of measurement.

LIST OF REFERENCE NUMERALS 1 square-wave current waveform
2 cycle
3 first half cycle
4 second half cycle
5 sensor signal
6 zero point line
7 assumed zero point line
8
9
10
11 square are-wave current waveform
12 cycle
13 first half wave
14 second half wave
15 sensor signal

The invention claimed is:

1. A method of determining a zero point of a current sensor in a circuit for operating a gas discharge lamp, the method comprising the acts of:
   switching off a current through the current sensor for a first period during a first half wave;
   determining a first test value;
   switching the current through the current sensor for a second period during a second half wave having a different polarity;
   determining a second test value;
   forming an average value of the first test value and the second test value; and
   determining the zero point by means of said average value, wherein final test values of the current sensor immediately before a renewed switch-on of the current is used for determining the zero point.

2. The method as claimed in claim 1, wherein the switching-off acts takes place in the first half wave and the second half wave in succession.

3. The method as claimed in claim 1, wherein a position of a current blanking interval void within at least one the first half wave and the second half wave is varied.

4. The method as claimed in claim 3, wherein the current is increased in the time before or after the current blanking interval.

5. A method of determining a zero point of a current sensor in a circuit for operating a gas discharge lamp, the method comprising the acts of:
   switching off a current through the current sensor for a first period during a first half wave;
   determining a first test value;
   switching off the current through the current sensor for a second period during a second half wave having a different polarity;
   determining a second test value;
   forming an average value of the first test value and the second test value; and
   determining the zero point by means of said average value, wherein an interval between two measurement groups, each group consisting of two measurements in two respective half waves of different polarity in succession, amounts to several seconds up to minutes.

6. The method as claimed in claim 5, wherein the interval between the two measurement groups is varied.

7. A circuit arrangement for a high-pressure gas discharge lamp the circuit arrangement comprising:
   means for switching off a current through the current sensor for a first period during a first half wave;
   means for determining a first test value;
   means for switching off the current through the current sensor for a second period during a second half wave having a different polarity;
   means for determining a second test value;
   means for forming an average value of the first test value and the second test value; and
   means for determining the zero point by means of said average value, wherein final test values of the current sensor immediately before a renewed switch-on of the current is used for determining the zero point.

8. A projection system with a circuit arrangement for high-pressure gas discharge lamps, the circuit arrangement comprising:

means for switching off a current through the current sensor for a first period during a first half wave;

means for determining a first test value;

means for switching off the current through the current sensor for a second period during a second half wave having a different polarity;

means for determining a second test value;

means for forming an average value of the first test value and the second test value; and means for determining the zero point by means of said average value, wherein final test values of the current sensor immediately before a renewed switch-on of the current is used for determining the zero point.

* * * * *